United States Patent
Paweletz et al.

(10) Patent No.: US 10,312,787 B2
(45) Date of Patent: Jun. 4, 2019

(54) SAFETY SYSTEM FOR AN ASSEMBLY FOR MOVING TRANSPORT BODIES

(71) Applicant: Robert Bosch GmbH, Stuttgart (DE)

(72) Inventors: Anton Paweletz, Fellbach (DE); Markus Hanisch, Markgroeningen (DE); Sebastian Gran, Frankfurt am Main (DE); Joshua Windsheimer, Satteldorf (DE); Heike Raatz, Stuttgart (DE)

(73) Assignee: Robert Bosch GmbH, Stuttgart, DE (US)

( * ) Notice: Subject to any disclaimer, the term of this patent is extended or adjusted under 35 U.S.C. 154(b) by 210 days.

(21) Appl. No.: 15/526,319

(22) PCT Filed: Oct. 21, 2015

(86) PCT No.: PCT/EP2015/074380
§ 371 (c)(1),
(2) Date: May 11, 2017

(87) PCT Pub. No.: WO2016/091441
PCT Pub. Date: Jun. 16, 2016

(65) Prior Publication Data
US 2017/0331359 A1 Nov. 16, 2017

(30) Foreign Application Priority Data
Dec. 8, 2014 (DE) .................. 10 2014 225 171

(51) Int. Cl.
*H02K 41/02* (2006.01)
*H02K 41/03* (2006.01)
(Continued)

(52) U.S. Cl.
CPC ........... *H02K 41/031* (2013.01); *B65G 54/02* (2013.01); *H01L 21/67709* (2013.01);
(Continued)

(58) Field of Classification Search
CPC ...... B65G 54/02; H02K 41/02; H02K 41/031; H02K 3/47
(Continued)

(56) References Cited

U.S. PATENT DOCUMENTS 6,633,217 B2 * 10/2003 Post .................. B60L 13/04
104/281
6,664,880 B2 * 12/2003 Post .................. B60L 13/04
104/281
(Continued)

FOREIGN PATENT DOCUMENTS

EP 2 365 617 A2 9/2011
WO 2013/059934 A1 5/2013

OTHER PUBLICATIONS

International Search Report corresponding to PCT Application No. PCT/EP2015/074380, dated Apr. 14, 2016 (German and English language document) (5 pages).

*Primary Examiner* — Thanh Lam
(74) *Attorney, Agent, or Firm* — Maginot, Moore & Beck LLP

(57) ABSTRACT

A transport system and a system for moving permanent-magnet-excited transport bodies by an inductively excited magnetic field includes induction coils, a movably supported first reluctance element, and an actuator. The induction coils are configured for a current to flow through the induction coils in order to drive the transport bodies in a plane without contact. The actuator is configured to bring the first reluctance element from a first position into a second position. The permanent magnetic field of a transport body located over the first reluctance element experiences a lower magnetic resistance in a magnetic circuit through the first reluctance element in the second position than in the first position.

12 Claims, 12 Drawing Sheets

(51) Int. Cl.
*B65G 54/02* (2006.01)
*H01L 21/677* (2006.01)
*H02K 3/47* (2006.01)

(52) U.S. Cl.
CPC .......... *H02K 3/47* (2013.01); *H02K 2201/18* (2013.01); *H02K 2213/06* (2013.01)

(58) Field of Classification Search
USPC .............................. 310/12.09, 12.19, 12.21
See application file for complete search history.

(56) References Cited

U.S. PATENT DOCUMENTS

| | | | |
|---|---|---|---|
| 6,914,351 B2* | 7/2005 | Chertok ................. | H02K 33/16 310/12.26 |
| 6,983,701 B2* | 1/2006 | Thornton ................ | B60L 13/06 104/282 |
| 7,538,469 B2* | 5/2009 | Thornton ................ | H02K 1/08 310/12.18 |
| 2016/0070181 A1* | 3/2016 | Frissen ............... | G03F 7/70758 355/72 |

* cited by examiner

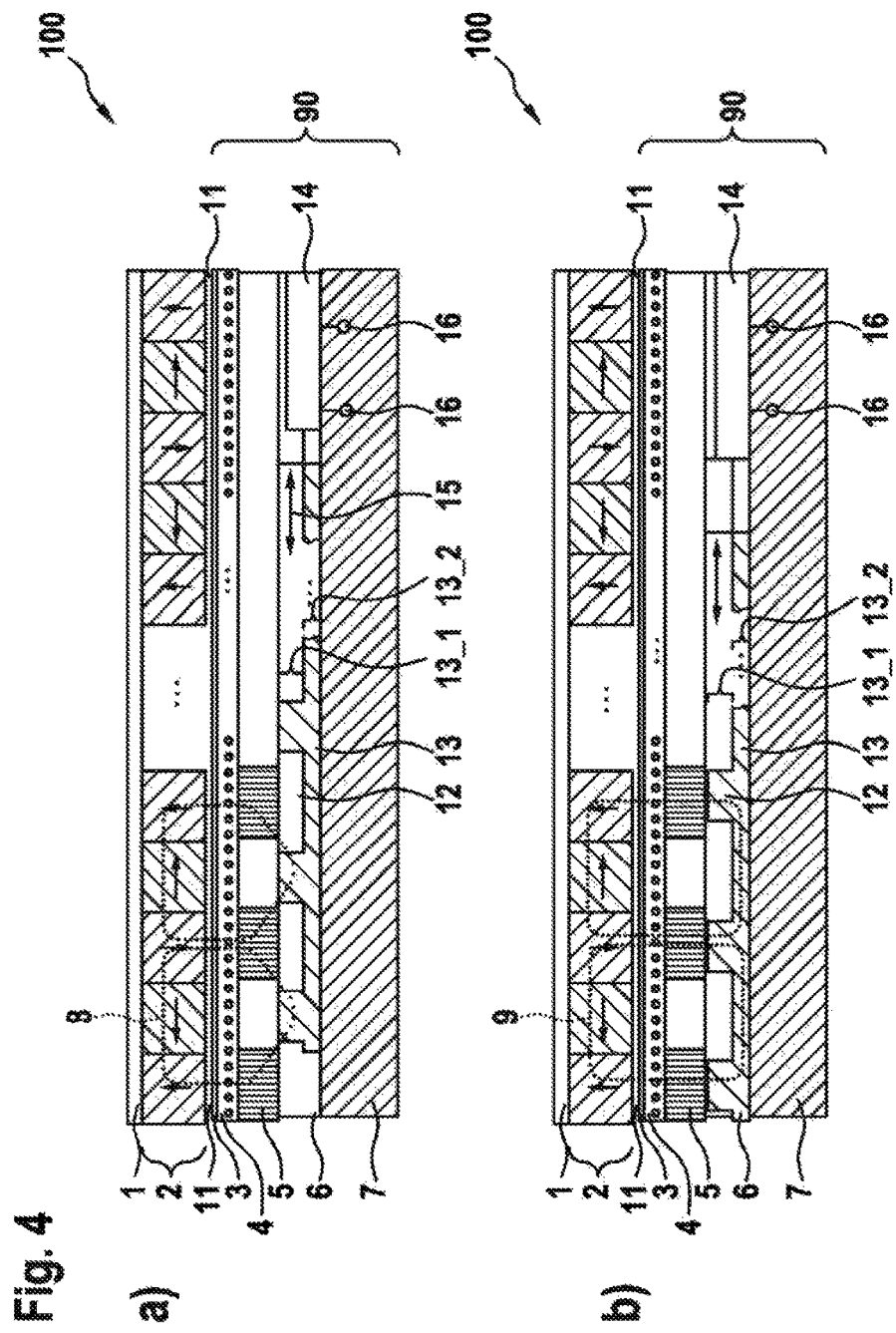

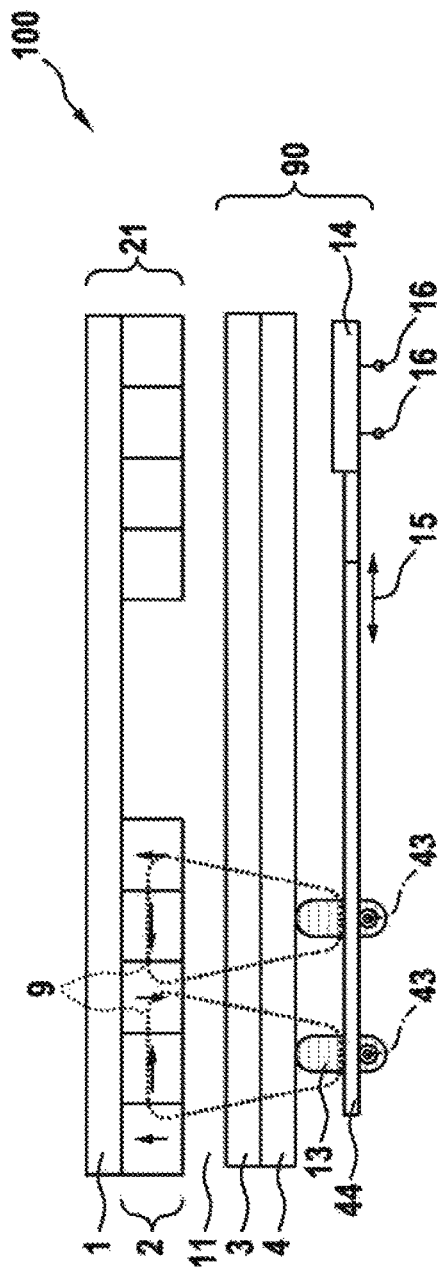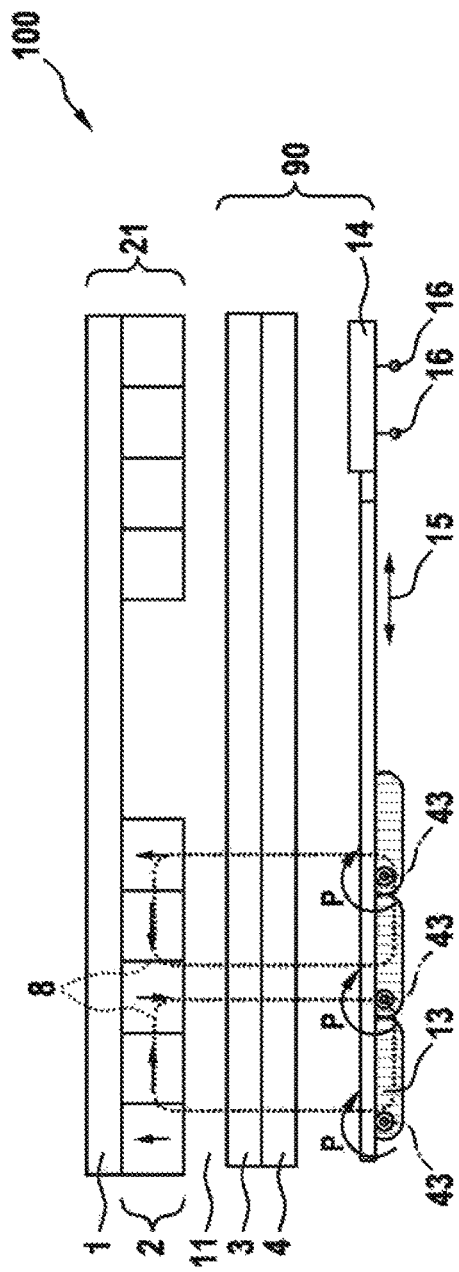

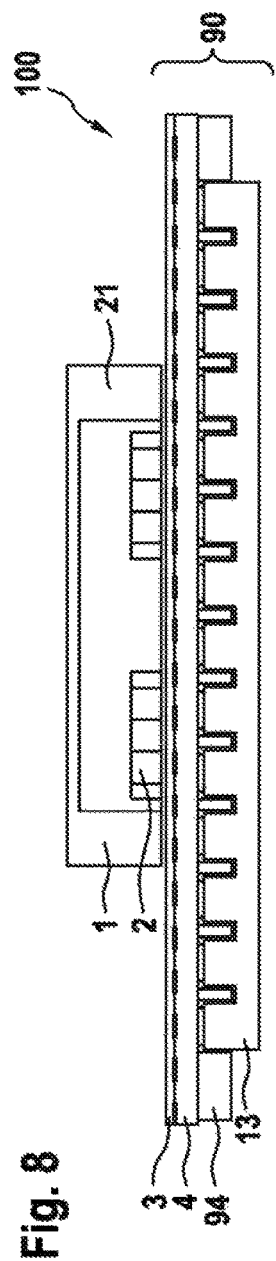
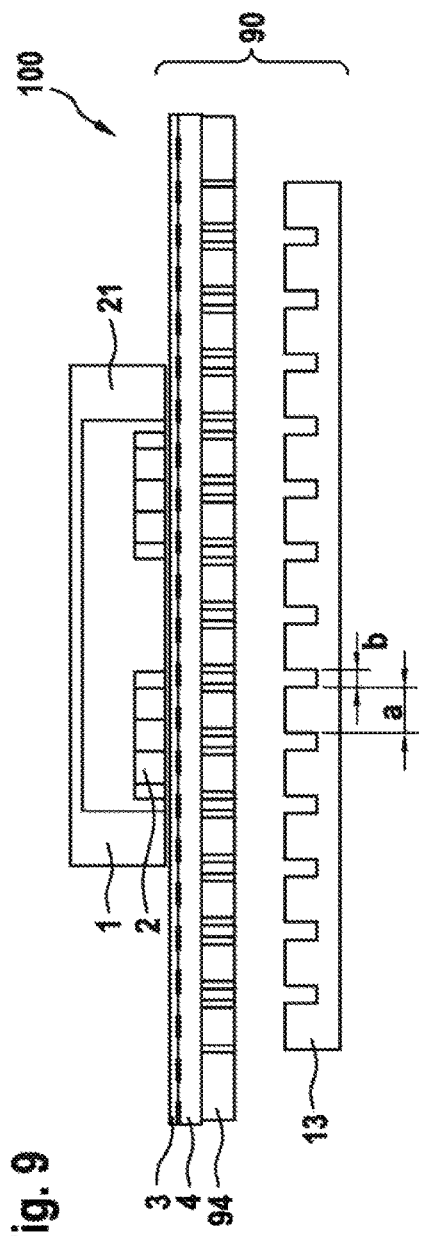

Fig. 12
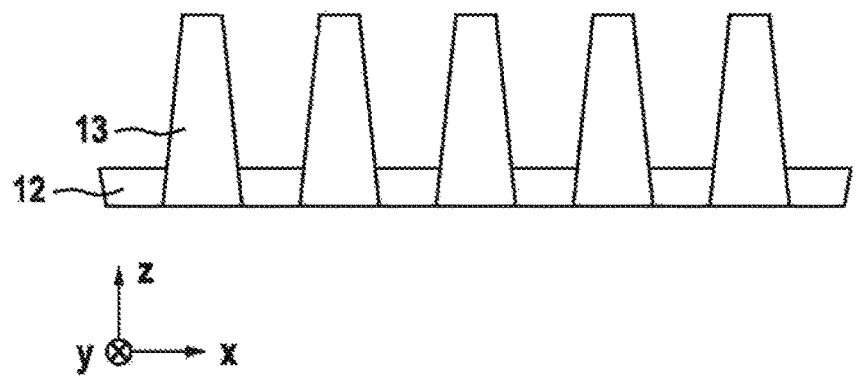
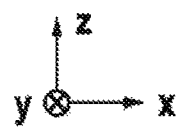
Fig. 13
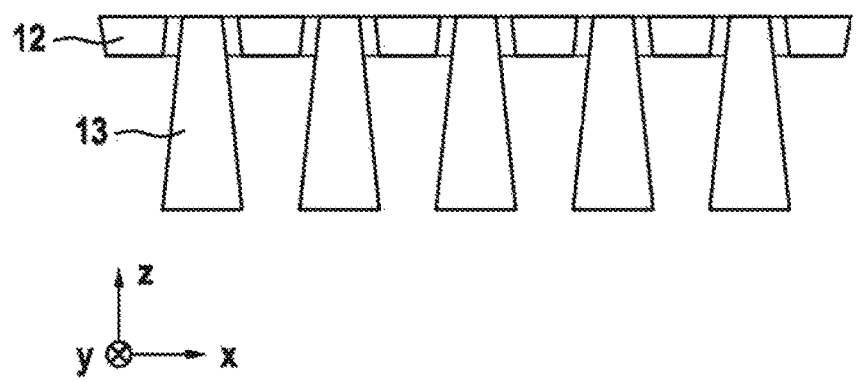
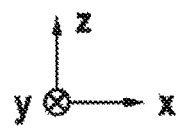

SAFETY SYSTEM FOR AN ASSEMBLY FOR MOVING TRANSPORT BODIES

This application is a 35 U.S.C. § 371 National Stage Application of PCT/EP2015/074380, filed on Oct. 21, 2015, which claims the benefit of priority to Serial No. DE 10 2014 225 171.0, filed on Dec. 8, 2014 in Germany, the disclosures of which are incorporated herein by reference in their entirety.

BACKGROUND

The present disclosure relates to a transport system and to a system for moving transport bodies excited by permanent magnets. In particular, the present disclosure relates to an automatic braking of the transport bodies in the event of an interruption in an electrical power supply, the aim being a fixed local arrangement of the transport bodies for braking the transport body under levitation.

There are known transport systems in which the transport bodies (known as movers) are supported with almost no friction in the electromagnetic field. The controllable electromagnetic forces are used both for the drive of the transport bodies and for electromagnetic linear support or levitation over a flat, electrically excited transporting area (also referred to as an X-Y stator). Such a system is described in WO 2013/059934 A1. The present disclosure is based expressly on the subject matter disclosed therein. It goes without saying that the safety device proposed according to the disclosure can however be used for all planar motor systems comprising transport bodies with a permanent magnet. A requirement when using such a drive is that it can also be used vertically. For example, the transport bodies can make it possible to transport items to be transported on a substantially vertical wall. Similarly, an arrangement overhead is conceivable. For this purpose, it must be ensured in particular in the event of an unforeseen powerless state that the transport bodies remain in their position, which is advantageous both with regard to safety at work and with regard to maintaining states in a process during an interruption in an electrical power supply.

The drive system of the system disclosed in WO 2013/059934 A1 has permanent magnets in the transport bodies that are provided in an X-Y Halbach array. The magnetic field of these permanent magnets interacts with the magnetic field of electrical conductors in the stator, which follow a specific X-Y arrangement made to match the magnets. The interaction of the permanent-magnetic Halbach systems with the electromagnetic fields occurring in the stator as a result of the current made to flow through the conductor tracks has the effect of generating the driving forces acting on the transport bodies in the directions X and Y and also a lifting force (carrying force) in the Z direction. One challenge is to ensure that, in particular in the event of a power failure, the transport bodies are safely braked and maintain their position. This applies both to the case of a horizontal arrangement and the case of a vertical arrangement of the stator and the transport bodies, in particular if the voltage supply fails suddenly and unexpectedly. Sometimes, while they are moving, the transport bodies still have relatively great amounts of kinetic energy, which on the one hand depends on the moved (feeder) mass and on the other hand on the current speed at the moment of power failure. Due to the fact that the friction in both directions of the plane of movement (X/Y direction) is very small, the carrying bodies can under some circumstances still cover relatively long distances and cause damage to the stationary drive elements, other components of the transport system or even to persons. With the systems that are known in the prior art, the braking is performed by switching over the control to braking mode and powerless stopping for example as follows: when there is a voltage failure of the supply voltage, the kinetic energy of the transport bodies is recovered in a battery or a "super cap" in the DC link of the drive system or dissipated in a braking resistance. The braking may also be assisted/realized by using an energy buffer (uninterruptible power supply, UPS), so that active braking by means of the drive components of the transport system is possible. Without a UPS, it is not possible however to establish a safe setup of the systems that are known in the prior art.

It is an object of the present disclosure to alleviate or eliminate the aforementioned disadvantages.

SUMMARY

The object identified above is achieved according to the disclosure by a system for moving transport bodies excited by permanent magnets over an inductively excited magnetic field. The transport bodies may be used for example for transporting small and lightweight containers or articles, such as are used for example for medicaments (for example as ampoules, as test tubes or the like). For generating the magnetic field that is required for the drive and the carrying force, a system of induction coils, which are aligned in the x and y coordinates, is provided in the stator. A controlled electrical signal may be applied to these coils in order to produce on the one hand a stable position, on the other hand a desired propulsion in a predefined direction. The system according to the disclosure also comprises an adjustable first reluctance element (supported in the stator) and an actuator, the latter being designed to bring the first reluctance element from a first position into a second position. The two positions differ with respect to the transport body in that the permanent magnetic field of the transport body located over the first reluctance element experiences a smaller magnetic resistance in a magnetic circuit as a result of the first reluctance element in the second position than in the first position. In other words, the position of the first reluctance element in the second position (safety position, for example in the event of a power failure) leads to a lower overall magnetic resistance for the magnetic field lines of the permanent magnets, the magnetic interfacial forces also increasing as a result of the increased magnetic flux. On the one hand, this has the effect that the normal force on the transport body increases and, in the case of an induction coil arrangement in the system that is completely without any power supply, the frictional forces between the transport body and a surface of the system increase. The reluctance elements in the second position may be aligned in such a way as to produce in the respective direction (coordinate x, or y) local regions in which the magnetic resistance in each case achieves its minimum value (latched positions). These minima of the magnetic resistance may be at intervals corresponding to half the pole pitch of the Halbach magnet systems in the transport bodies. On the other hand, the increased magnetic forces have the effect of generating or intensifying magnetic forces counter to the direction of the movement of the transport body in the plane, thanks to the inhomogeneity described above of the stator reluctance in the direction of movement. In this way, the transport bodies can be safely braked and an uninterruptible power supply is not absolutely necessary for carrying out the braking operation, even if active braking and setting down of the transport bodies is desirable to spare the surface of the stator. At a standstill and set down on the surface, the removal or displacement of transport bodies can be prevented by a safety system.

The subclaims show preferred developments of the disclosure.

The system is preferably designed to change the magnetic resistance of the system for a permanent magnetic field excited by a transport body by means of the first reluctance element to a greater degree at a position over the first reluctance element than at a position alongside the first reluctance element. In other words, the inhomogeneity of the reluctance in a horizontal direction or in the direction of movement of the transport body is increased from the perspective of the transport body in the stator as soon as the first reluctance element is brought into the second position. In other words, the overall magnetic resistance is reduced from the perspective of the transport body, and as a result the magnetic flux is increased, as soon as the first reluctance element is brought into the second position, whereby the distance between the reluctance element and the permanent magnet array is reduced. In this way, the permanent magnetic field of the transport bodies can ensure a safe position of the transport bodies independently and without a power supply (in the powerless state) in the event of a power failure.

The actuator may be designed to bring the first reluctance element into a changed position with respect to a (for example fixed) second reluctance element of the system in order to change, in particular reduce, an overall magnetic resistance through the first reluctance element and the second reluctance element. The first reluctance element and the second reluctance element may for example here jointly form a magnetic circuit for the permanent magnetic field of the transport bodies and, if the first reluctance element is arranged in the second position, oppose the magnetic field with a smaller magnetic resistance. In this way, the magnetic field is intensified by the magnetic forces at the interfaces of the second reluctance elements, which are in particular arranged closer to the transport body or at the air gap of the transport system. This also increases the braking forces on the transport bodies, which otherwise slide away comparatively unhindered.

The actuator may also be designed to change a distance between the first reluctance element and the second reluctance element. In particular, the distance in the z direction in relation to the transport bodies ("magnetic gap") may be greater in the first position of the first reluctance element than in the second position of the first reluctance element. An increase in the distance represents a comparatively strong increase in the magnetic resistance in dependence on a displacement under consideration of the first reluctance element.

One possibility of using the actuator for the movement of the first reluctance element is that of displacing the first reluctance element substantially parallel to the plane of the direction of movement of the transport bodies and alternatively or additionally substantially perpendicular to the plane of the direction of movement of the transport bodies. The distance between the first reluctance element and the magnet array is generally referred to as the "air gap", even if it is filled by various materials with magnetic properties similar to those of air. The plane of the direction of movement coincides here substantially with the direction of extent of the air gap between the transport body and the system according to the disclosure. Alternatively or additionally, the actuator may rotate the first reluctance element about an axis situated substantially parallel to the plane of movement of the transport bodies. For example, the rotation may have the effect that there is a smaller distance between the permanent magnet of the transport body and the first reluctance element in the second position.

The first reluctance element may preferably comprise laminated sheet-metal elements, which are in particular in the first position oriented substantially perpendicular to the plane of the direction of movement of the transport bodies. In particular for the case where the first reluctance element is arranged substantially in such a position of a potential magnetic circuit in which, on account of its direction of extent, it is intended to conduct a substantially horizontal component of the magnetic field, the magnetic resistance of the first reluctance element is particularly high and the inhomogeneity of the magnetic forces is low. As a result, the braking forces are low, for which reason the first position is also referred to as the "drive mode". Correspondingly, the orientation of the laminated sheet-metal elements of the first reluctance element in the second position may be substantially parallel to the plane of the direction of movement of the transport bodies. The second reluctance elements may also comprise laminated sheet-metal elements, these being oriented in particular in such a way that the surfaces of the layers lie in such a plane at which they are adjacent to the first reluctance element, at least in the second position of the first reluctance element. This avoids a lateral emergence of magnetic field lines from the second reluctance element and prevents an undesired reduction of the magnetic resistance in the first position of the first reluctance element.

The first reluctance element may at least partially comprise two frustopyramidal recesses, which may be (partially) filled by corresponding second reluctance elements. The second reluctance elements may have here a cross section that continuously decreases in a direction perpendicular to the plane of the direction of movement of the transport bodies. For example, the second reluctance elements may have a frustopyramidal or frustoconical shape. For example, the actuator may thus be designed to move the first reluctance element perpendicularly in relation to the plane of the direction of movement of the transport bodies (that is to say up and down, or in the Z direction). This then necessarily produces a different distance from the second reluctance element or the second reluctance elements for the different position of the first reluctance element. The first reluctance element may preferably have a surface that corresponds over the surface area to a surface of the second reluctance elements, at least in the second position. In other words, there is an interface over as large a surface area as possible between the first reluctance element and the second reluctance element when the first reluctance element is in the second position. The distance between the first reluctance element and the second reluctance element is chosen here in particular to be very small. Such a setup is obtained in particular whenever the interfacial portions are substantially parallel and the surface of the first reluctance element in this way lies closely against the surface(s) of the second reluctance element or the second reluctance elements.

In order in the event of the power failure to be able to bring about a movement of the first reluctance element, the actuator may have an energy storage means, which for example comprise as a spring (mechanical elasticity) and/or a hydraulic or pneumatic or electrical energy store. Depending on the conditions of the plant in which the system according to the disclosure is operated, the one or other form of energy storage may prove to be particularly suitable. If for example there is a compressed air supply, the compressed air stores may even in the event of a power failure provide a power supply (for a limited time), and consequently make actuation of the system possible.

According to a second aspect, a transport system that has a system according to the first-mentioned aspect of the disclosure and at least one transport body is proposed. The transport body comprises a carrying body, on which the items to be transported can be positioned, and permanent magnets, which may for example be provided in a Halbach array. The permanent magnets are arranged along the air gap of the system. In other words, the permanent magnets follow substantially the direction of extent of the air gap. They are designed to produce a magnetic pattern, so that, together with the reluctance element of the system according to the disclosure, a strongly location-dependent force effect is obtained in the direction of the plane, location-dependent differences in the force effect being produced or intensified by the first reluctance element in the second position. In this way, a magnetic braking force on the transport bodies that acts counter to the direction of movement is obtained as soon as the first reluctance elements have assumed the second position. This is however mainly a result of the magnetic force acting normal to the transport body, which due to the surface friction leads to a braking force counter to the direction of movement. An unintentional displacement of the transport bodies is therefore made more difficult or prevented.

A transport system constructed according to the disclosure can be realized in a particularly space-saving and weight-saving manner. The integration in the X-Y stator allows the stator structure to be modularized. The achievable delays between a power failure and a braking operation are deterministic and as small as possible. An effective braking effect in a first braking phase can even be achieved in the system without great electrical stores or voltage buffering. In this phase, a counterforce to the current direction of movement can be generated by corresponding electrical activation of the power electronics. The energy necessary for this comes from the kinetic energy of the transport body and is appropriately converted in the regenerative operation of the drive. The due to the movement of the transport body and due to the effect of its permanent magnets to a standstill, a voltage is produced in the stator windings (known as back EMF) and the stator current can still continue to flow. Due to its corresponding modulation in the controller, a braking force is produced and assists the braking operation. With the speed close to zero, the braking is taken over powerlessly by the variable reluctance system described above.

Moreover, no mechanical connections to the transport bodies are required. A vertical installation of the stators is possible, since the transport bodies are prevented from falling off. It goes without saying that a number of transport bodies may be arranged on a system according to the disclosure. The transport bodies may make different functionalities possible. Moreover, a direct interaction of the operator with the system is possible in a position that has been made safe (the first reluctance elements are in the second position). There is no longer any risk of pinching. In the powerless state, the transport bodies are kept fixedly and rigidly in connection with the system. The transport bodies can thus no longer be removed, or only by expending considerable force. A risk of pinching due to forces of attraction between two transport bodies or a transport body and a magnetically conductive material is averted. The transport bodies made safe according to the disclosure cannot be displaced in the magnetic field. They remain assigned to the position at the time of the power failure and cannot be exchanged or turned. In this way, a disturbance of the transporting operation can be avoided and a relative assignment retained. The magnetic coupling at a predefined position allows the working forces to be increased. Shifting the high loading into the passive state makes energy-related optimizations possible.

BRIEF DESCRIPTION OF THE DRAWINGS

Exemplary embodiments of the disclosure are described in detail below with reference to the accompanying drawings, in which:

FIG. 4 shows a schematic illustration of an alternative embodiment of the first reluctance elements in an exemplary embodiment of a transport system according to the disclosure;

FIG. 5 shows a schematic view of an exemplary embodiment with rotatable first reluctance elements in a second position;

FIG. 6 shows a schematic view of an exemplary embodiment with rotatable first reluctance elements in a first position;

FIG. 8 shows a schematic exemplary embodiment of a transport system according to the disclosure with a vertically displaceable profiled reluctance element in a second position;

FIG. 9 shows a schematic exemplary embodiment of a transport system according to the disclosure with a vertically displaceable profiled reluctance element in a first position;

FIG. 12 shows a lateral view of a detail of a two-part reluctance system comprising frustopyramidal first reluctance elements with a second reluctance element as a yoke in a second position;

FIG. 13 shows a lateral view of a detail of a two-part reluctance system comprising frustopyramidal first reluctance elements with a second reluctance element as a yoke in a first position;

DETAILED DESCRIPTION

Figure 1:
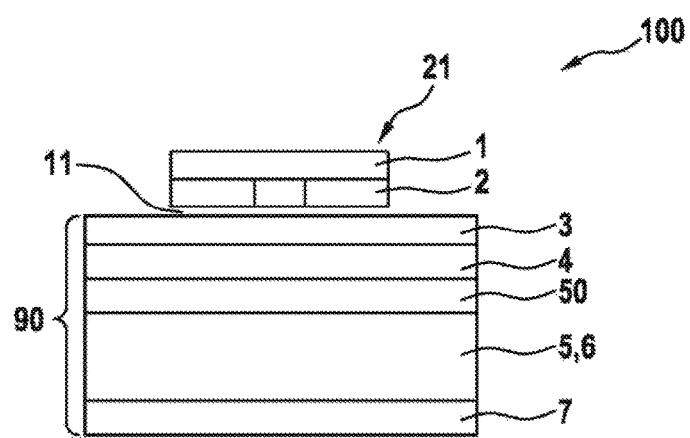
FIG. 1 shows a side view of the basic structure of an exemplary embodiment of a transport system according to the disclosure.

FIG. 1 shows a transport system 100 according to the disclosure, in which a transport body 21 is suspended by means of a magnetic field over a (stator) system 90 according to the disclosure. The transport body 21 comprises a main body 1 as a carrying body, under which permanent magnets 2 are arranged. Under the air gap 11, the system 90 has a stator layer with position sensors 3 and a stator layer lying thereunder with a winding system 4 for generating the carrying forces and also the propulsive forces. Introduced under the winding system 4 is a purely stiffening plane 50. This must not consist of a magnetically conductive material. Arranged under the stiffening plane 50 is a reluctance layer 5, 6, in which a static reluctance layer 5 and a movable reluctance layer 6 are contained. Here there is the option of "driving" the movable reluctance layer 6 (or its movable reluctance elements) into the stiffening plane 50, in order that the distance from the permanent magnets 2 of the transport body 21 can be further reduced and in this way the magnetic forces can be increased. By means of the movable reluctance layer 6, according to the disclosure the magnetic holding force that can be generated can be influenced in the event of a power failure. A lowermost layer of the system 90 forms a flat housing 7 with power electronics and activation electronics distributed over the surface area. The power and activation electronics are designed to receive position values from the signals of the position sensors 3 for correcting the electrical input variables for the winding system 4 (control of the currents and consequently the position) and to convert them into electrical input variables for the winding system 4.

Figure 2:
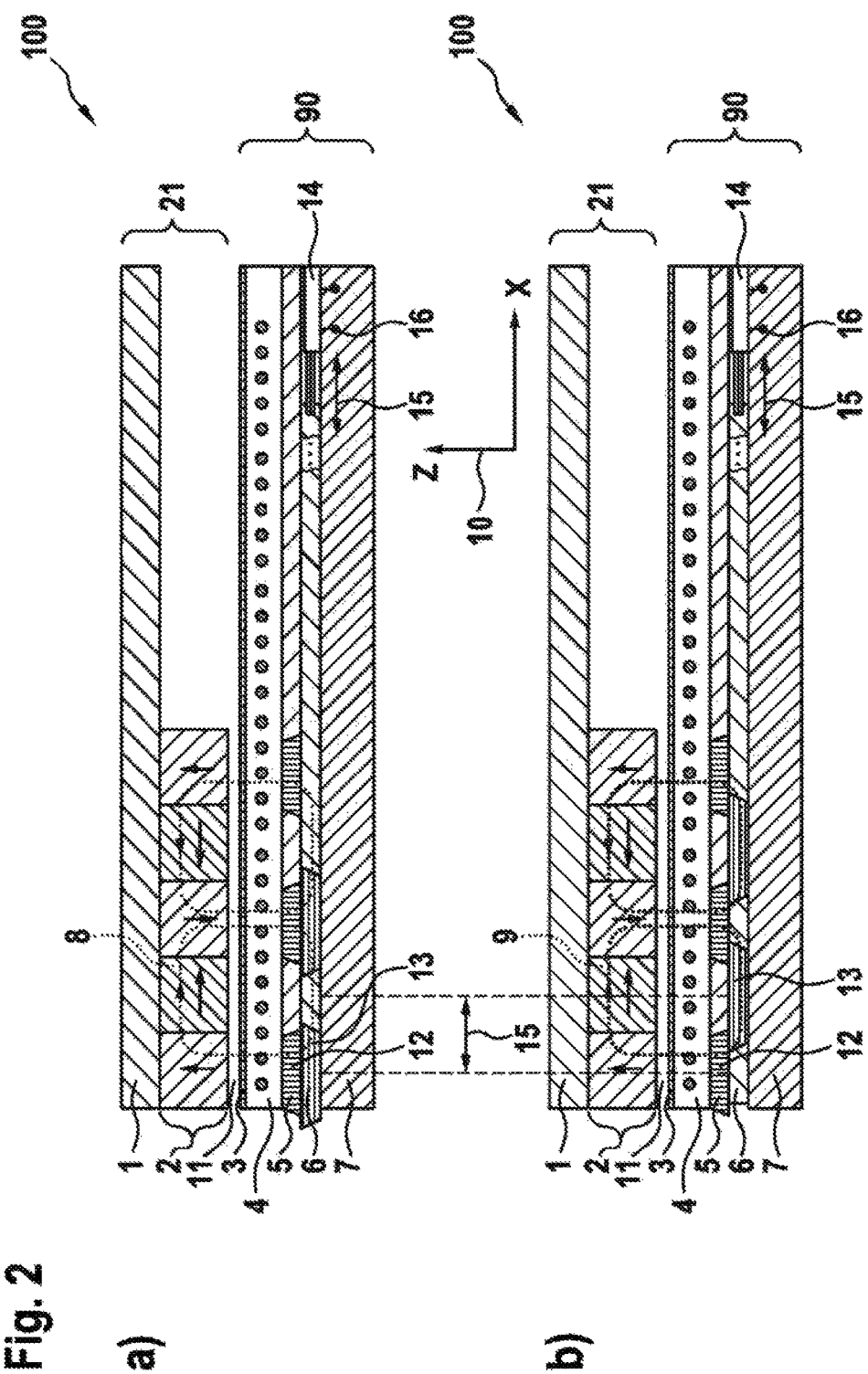
FIG. 2 shows a schematic illustration of a specific exemplary embodiment of a transport system according to the disclosure with horizontally movable first reluctance elements.

FIG. 2 shows in the upper diagram a) a possible geometrical arrangement of the permanent magnetic elements 2 of the transport body 21 and also a possible arrangement and configuration of the elements of the system 90 according to the disclosure. The permanent magnets 2 are arranged such that they are oriented alternately in four different directions (upward, to the right, downward, to the left). This arrangement corresponds to the Halbach array. This arrangement serves the purpose that the overall magnetic field that is formed by the magnetic fields of the individual magnetic bars (top, right, bottom left, . . . ) forms mainly under the transport body. This is of significance not only for the powerless state, but also for the normal state (drive mode). In the first position, which is shown, the trapezoidal static reluctance elements 12 are however arranged substantially congruent with the reluctance elements 13 arranged displaceably by way of an actuator 14. In this way, the stacks of reluctance elements arranged next to one another are substantially magnetically insulated from one another. A stacking direction or laminating direction of sheet-metal elements of the reluctance elements 12, 13 is indicated by a vertical or horizontal dashed line. A preferential direction for magnetic flux conductance for the static reluctance elements 12 is therefore obtained in the vertical direction, while it lies in the horizontal direction for the displaceable reluctance elements 13. The magnetic field 8, which over great distances has to be completed by a magnetic insulator located between the movable (first) reluctance elements 13, is correspondingly not very intense. In the event that the induction coils of the winding system 4 no longer conduct an electric current because of a power failure and can no longer offer the transport body 21 a predefined propulsion, a small braking force is obtained in the setup shown. Additionally shown are the electrical contacts 16 with respect to the housing with distributed power electronics and activation for the actuator 14. The displacement of the latter is indicated by a double-headed arrow 15. A system of coordinates 10 shows the position of the X direction and the Z direction.

FIG. 2b) shows the setup shown in subfigure a) after the actuator 14 has responded in response to an interruption of a supply current and the displaceable reluctance layer 6 has been displaced into such a position that the displaceable first reluctance elements 13 form a bridge between the static reluctance elements 12. The permanent magnetic field 9 that is produced is correspondingly much stronger, since the magnetic air gaps between the reluctance elements 12 have been eliminated by the displacement of the lower reluctance layer 6 (the lines have correspondingly been shown bolder at 9). The inhomogeneous reluctance of the system 90 leads to a preferential positioning of the transport bodies 21, to be precise such that the vertically oriented permanent magnets 2 come to a stop over the static reluctance elements 12 of the system 90.

Figure 3:
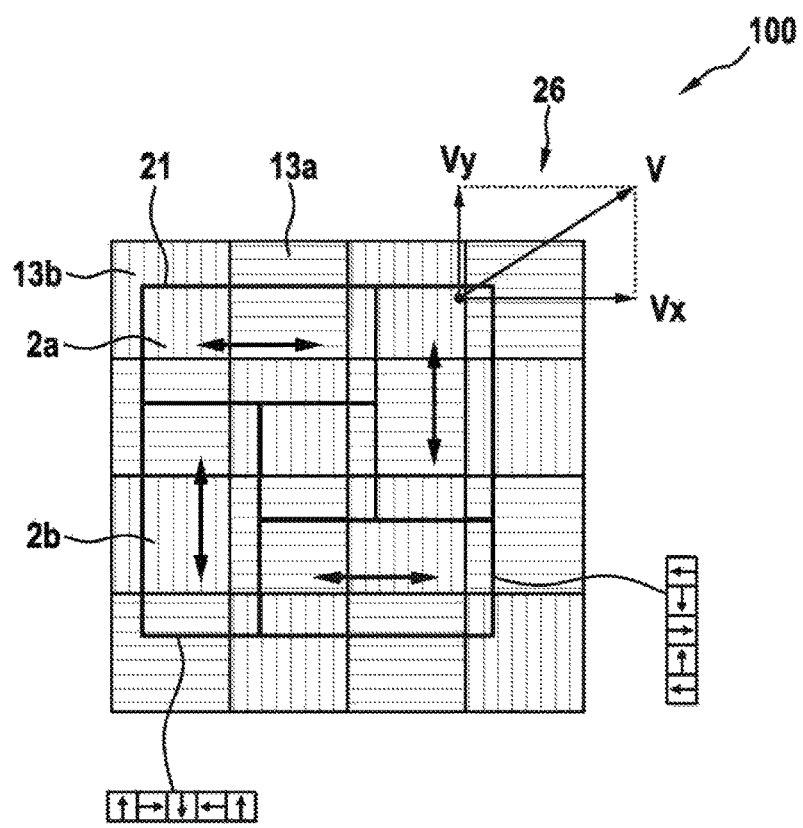
FIG. 3 shows an illustration of a schematic structure of the reluctance elements in the static reluctance layer.

FIG. 3 shows the exemplary embodiment from FIG. 2 in a schematic plan view. Here, the three-dimensional character is evident by viewing FIGS. 2 and 3 together. The Halbach permanent magnets of the transport body 21 are denoted by 2a and 2b, the magnets 2a being aligned in the X direction and the magnets 2b being aligned in the Y direction. The controllable first reluctance elements are denoted by 13a and 13b, 13a denoting the reluctance elements oriented in the X direction and 13b denoting the reluctance elements oriented in the Y direction. The system of coordinates 26 identifies the speed components of the transport body 21 in the direction of extent of the air gap (corresponding to the plane of the drawing). The surface area of the transport body 21 corresponds to a multiplicity of controllable first reluctance elements 13a, 13b (see also FIG. 2). In the embodiment shown, the surface area corresponds exactly to nine first reluctance elements 13a, 13b with an alignment alternating in a checkerboard manner (in the X direction and in the Y direction).

FIG. 4 shows a variation of the exemplary embodiment illustrated in FIG. 2, subfigure a) showing the displaceable reluctance layer 6 in a "drive mode" (normal position) and subfigure b) showing the first reluctance layer 6 in the "safety mode" (safety position). As a difference from the first reluctance elements 13 in FIG. 2, the flanks of the first reluctance elements 13 shown in FIG. 4 are kept substantially vertical. The first reluctance layer 6 has here a one-piece first reluctance element 13, which has structures 13_1 that correspond to the static (second) reluctance elements 12 and are connected to one another by way of a substantially horizontally extending yoke strip 13_2. By analogy with the embodiment shown in conjunction with FIG. 2, which discloses a linear displacement of the reluctance elements 13, a comparable effect can be achieved by way of a rotational displacement about the Z axis.

FIG. 5 shows an exemplary embodiment in which the first reluctance elements 13 are supported rotationally on a respective horizontal axis 43. With respect to the axis 43, the first reluctance elements 13 are eccentrically suspended. A toothed rack 44 corresponds to gearwheels arranged in the region of the axes 43, so that, by way of the toothed rack 44, an actuator 14 can ensure by movement along a double-headed arrow 15 that, in the second position of the first reluctance elements 13 shown in FIG. 5, a distance between the first reluctance elements 13 and the transport body 21 is minimal and the sheet-metal elements are stacked one above the other in the vertical direction. In this way, a minimal magnetic resistance is obtained for the magnetic field lines 9 that form as a result of the permanent magnets 2 of the transport body 21. The other elements correspond substantially to those of the exemplary embodiments shown in conjunction with FIGS. 2 and 4.

FIG. 6 shows the embodiment shown in FIG. 5 after the actuator 14 has detected a restoration of the electrical power supply. By way of the toothed rack 44 and the gearwheels 43, the actuator 14 performs such a displacement in the direction of the arrow 45 that the first reluctance elements 13 turn by 90° to the right in the direction of the respective arrows P. On the one hand, in this way the distance between the permanent magnets 2 of the transport body 21 and the first reluctance elements 13 increases, on the other hand the sheet-metal elements of the first reluctance elements 13 are then turned by 90° with respect to the main direction of the magnetic field lines 8, and consequently realize a particularly high magnetic resistance. The arrangement shown in FIG. 5, and FIG. 6, has the advantage that the support and the drive can be realized in a simplified manner.

Figure 7:
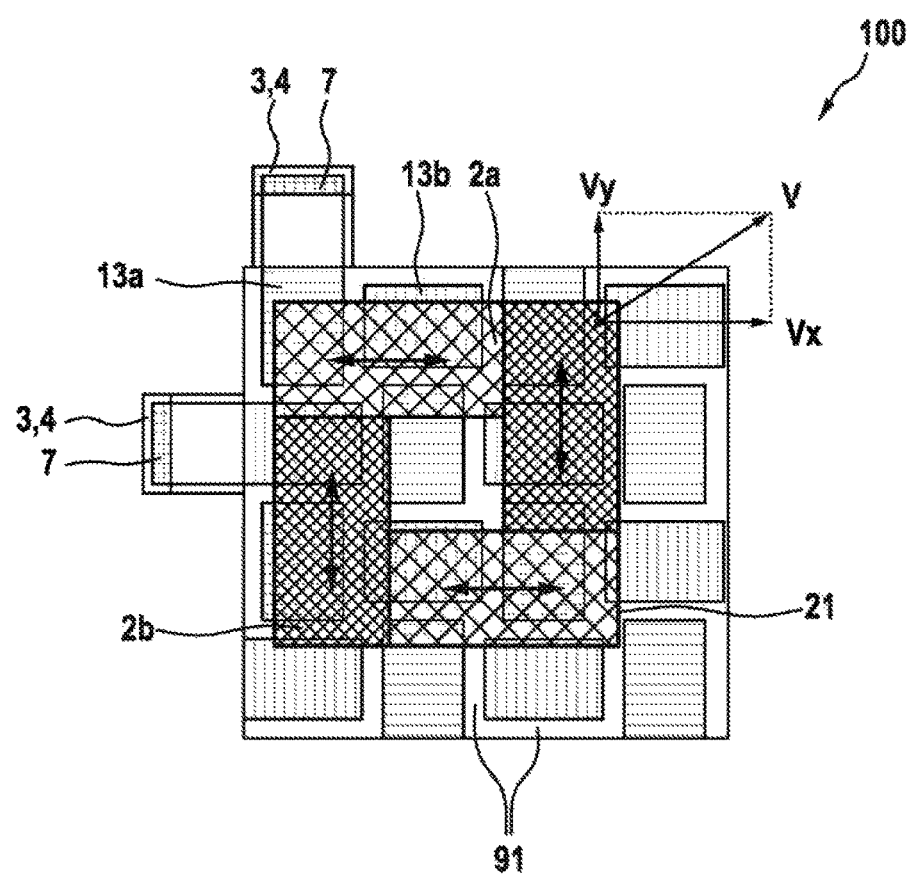
FIG. 7 shows a schematic plan view of an exemplary embodiment of a transport system according to the disclosure with rotatable first reluctance elements.

FIG. 7 shows a plan view of the exemplary embodiment shown in FIGS. 5 and 6 with controllable (for example rotatable) first reluctance elements 13a, 13b. The arrangement of the components of the stator, of the transport body 21 and of the reluctance elements 13a, 13b is segmentally embedded in the power-electronics and activation-housing layer 7 under the reluctance element layers 5, 6. Narrow connecting regions 91 border the edges of the controllable reluctance elements 13a, 13b and ensure a connection to the housing layer 7 and leadthrough of the electrical connections to the winding system of the stator.

Figure 10:
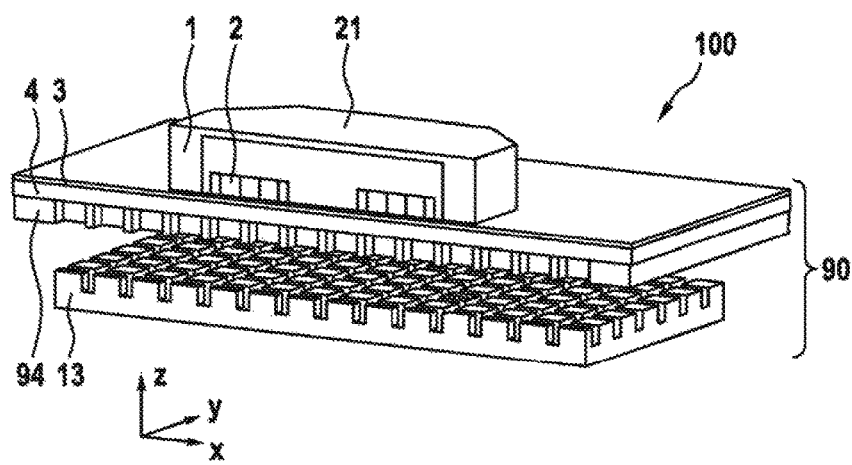
FIG. 10 shows a three-dimensional view of the exemplary embodiment shown in FIG. 9 of a transport system according to the disclosure with a safety system according to the disclosure.
Figure 11:
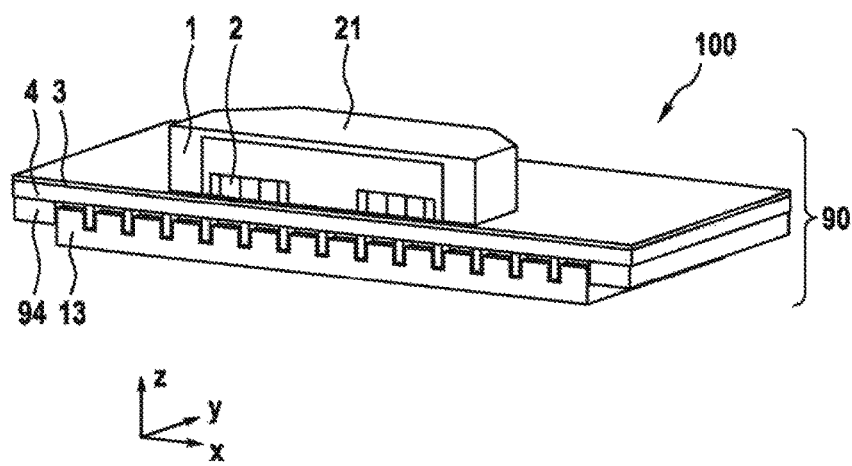
FIG. 11 shows a three-dimensional view of the exemplary embodiment shown in FIG. 8 of a transport system according to the disclosure with a safety system according to the disclosure.

FIG. 8 shows a side view of an alternative exemplary embodiment of a transport system 100 according to the disclosure, in which a profiled first reluctance element 13 can be displaced in the Z direction (vertically), in order to bring it from a first position into a second position. FIG. 8 shows the second position, in which the first reluctance element 13, profiled in a comb-shaped manner, is in engagement with a correspondingly configured stiffening plane 94. In this way, a distance from the permanent magnet 2 of the transport body 21 is minimal and the transport body 21 is magnetically braked. The braking effect is obtained for the most part from the forces of attraction of the magnets with respect to the magnetic return by way of the reluctance elements of the system 90, which have the effect of forming frictional forces (movement) and adhering forces (standstill). As a result of the profiled form of the first reluctance element 13, however, it is possible moreover to achieve a more or less pronounced latching, whereby a magnetic braking force is also generated in the direction of the x or y direction. The structure of the first reluctance element 13 may be formed identically in the X and Y directions, as shown in FIGS. 10 and 11 discussed below. This allows the forming of a single reluctance element 13, which equally operates the differently aligned Halbach array magnets 2 and makes it possible for the transport bodies 21 to be made safe direction-independently. The distance between the Halbach magnets 2 and the first reluctance element 13 may be reduced by matching the mechanical structure of the stiffening plane 94 and that of the first reluctance element 13, whereby greater holding forces can be achieved. The stiffening plane 94 consists of a diamagnetic or paramagnetic material. The first reluctance element 13 may be made up of a single ferromagnetic material or a combination of ferromagnetic materials. These also include electrical sheets (sheet-metal elements). Commonly used actuators, for example pneumatic cylinders, are suitable for the required displacement from the position 1 into this position. Owing to the nonlinear increase in the force of attraction in the z direction when there is a reduction in the air gap, a compensation on the actuator side can be achieved by way of suitable kinematics, mentioning by way of example a toggle lever.

FIG. 9 shows the exemplary embodiment introduced in FIG. 8 in a first position ("drive mode"), in which the reluctance element 13 has been removed by a predefined distance from the magnets 2 of the transport body 21. This distance is chosen such that the interaction of the magnetic fields of the magnets 2 with the reluctance element 13 is negligible. The ratio of a to b of the widths of the varyingly high reluctance element portions has a direct effect on how pronounced the holding and latching force is. If a>>b, the holding force is at a maximum and the latching force is at a minimum. If, on the other hand, a<<b, the holding force is at a minimum and the latching force is at a maximum. The holding force generally dominates over the latching force on account of the minimum distance between the first reluctance element 13 and the magnet 2 of the transport body 21, which corresponds to the overall height of the sensor layer 3 and the coil layer 4.

FIGS. 10 and 11 show the exemplary embodiment shown in FIGS. 8 and 9 and described above in an isometric view. Here it is evident that the dimensions a, b both in the X direction and in the Y direction describe the structure of the first reluctance element 13.

The reluctance element 13 may consist of a single mechanical component or mechanical components combined in an assembly. These elements may be displaced in relation to one another and independently of one another in the Z direction (that is to say in the direction of the transport bodies 21), in order for example to reduce the average force required to release the "safety mode" (second position) and possibly divide it among a number of actuators.

FIGS. 12 and 13 show an exemplary embodiment with a reluctance element divided in two. Here, the first reluctance element 13 consists of a recurrent frustopyramidal structure. This is mounted at a minimum distance, relevant to the safety mode, with respect to the magnets of the transport body. The frustopyramidal first reluctance elements 13 are surrounded by a static yoke 12, adapted with respect to its surfaces to the flanks of the first reluctance element 13, as a second reluctance element. It consists of a fixed component, which is mounted at the minimum distance, relevant to the safety mode, with respect to the permanent magnets of the transport body. The frustopyramidal first reluctance elements 13 are pushed into the yoke 12 to the maximum in the direction of the transport bodies in a way corresponding to FIG. 12, in order to minimize on the one hand the distance thereof from the transport body, on the other hand its distance from the yoke 12. In FIG. 13, the frustopyramidal first reluctance elements 13 have been displaced in the negative Z direction, in order to maximize the distance thereof from the transport body and also from the yoke 12. It goes without saying that a combination of this concept with the horizontal displacements of the first reluctance element 13 described with FIGS. 2 and 4 is likewise conceivable within the scope of the present disclosure.

In order to be able to perform the activation of the safety mode in the event of an absent power supply, passive actuators must to a certain extent store energy. For example, mechanical springs may be used for the transfer from drive mode to safety mode.

Figure 14:
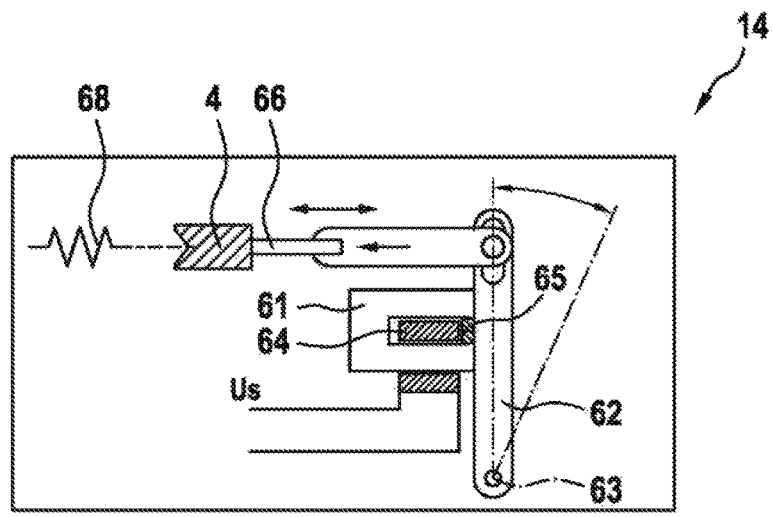
FIG. 14 shows a first exemplary embodiment of an actuator driven by spring force in a first position.

FIG. 14 shows a first exemplary embodiment of a toggle-lever actuator 14, which has two stable states. A lever 62 supported at the bottom by way of an axis 63 is kept in the position shown by two permanent magnets 65 and a coil 64 counter to the compressive force of a spring 68. By way of the first reluctance layer 4 and a piston 66, the spring 68 presses onto a substantially horizontally extended part of the toggle lever, which is supported in an elongated slot of a vertical lever 62. The coil 64 is supported in an actuator stator 61, which may for example consist of laminated metal sheets. If a supply voltage Us is switched off, the holding force generated by way of the coil 64 on the lever 62 ceases and the spring 68 overcomes the remaining holding force exerted by the permanent magnets 65.

Figure 15:
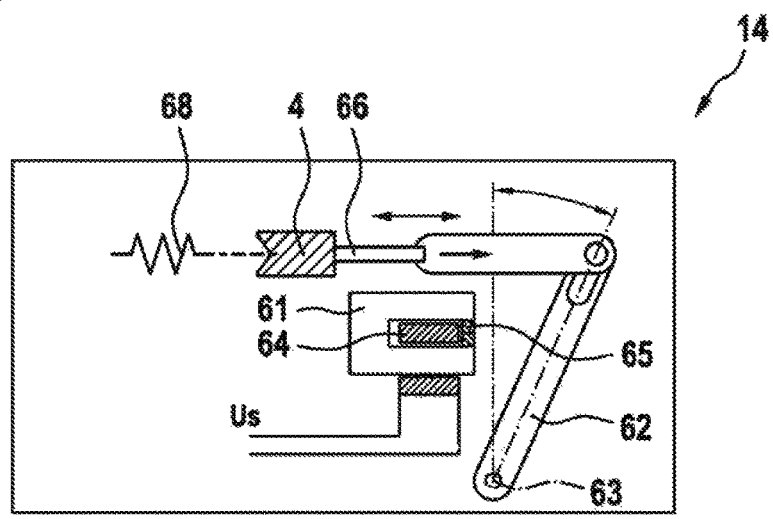
FIG. 15 shows a first exemplary embodiment of an actuator that can be driven by spring force in a second position.

FIG. 15 shows the result of switching off the supply voltage Us. The spring 68 has tilted the toggle lever by way of the piston 66, whereby the first reluctance layer 4 has entered a safety mode (second position). The states shown in FIGS. 14 and 15 are stable without power, as a result of which no additional losses have to be accepted during holding (safety mode) or during driving (drive mode). The voltage Us is reversible. Consequently, the position can be changed bistably by a voltage (for example a current pulse) that is applied to the coil 64.

Figure 16:
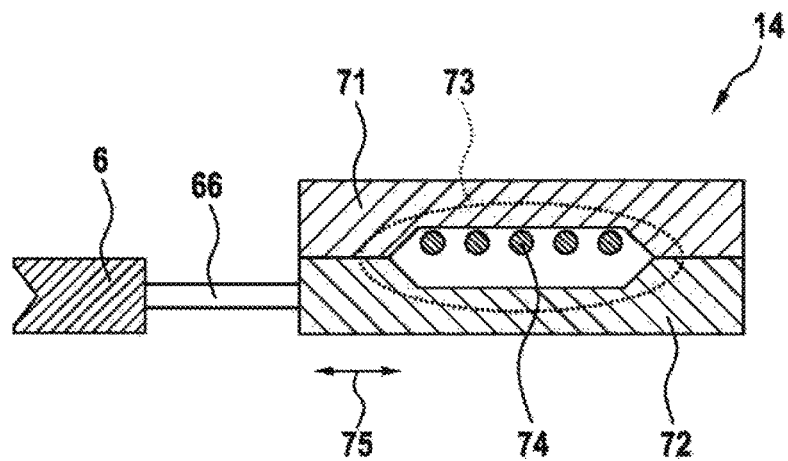
FIG. 16 shows a schematic side view of an alternative exemplary embodiment of an actuator with an electromagnetic linear drive in a first position.

FIG. 16 shows an alternative exemplary embodiment of an actuator 14, which makes a particularly flat form of construction possible by way of an electromagnetic linear coil arrangement. If the turns 74 are flowed through by the supply current (or some other current derived from the supply current), this produces a magnetic field 73, which is completed by way of the corresponding surface areas of the iron cores 71, 72. The lower half of the iron core 72 is coupled by way of a piston 76 to the movable reluctance layer 6. Moreover, a spring (not shown) is provided for biasing the movable reluctance layer 6 to the left. The direction of linear movement of the actuator 14 shown is indicated by a double-headed arrow 75.

Figure 17:
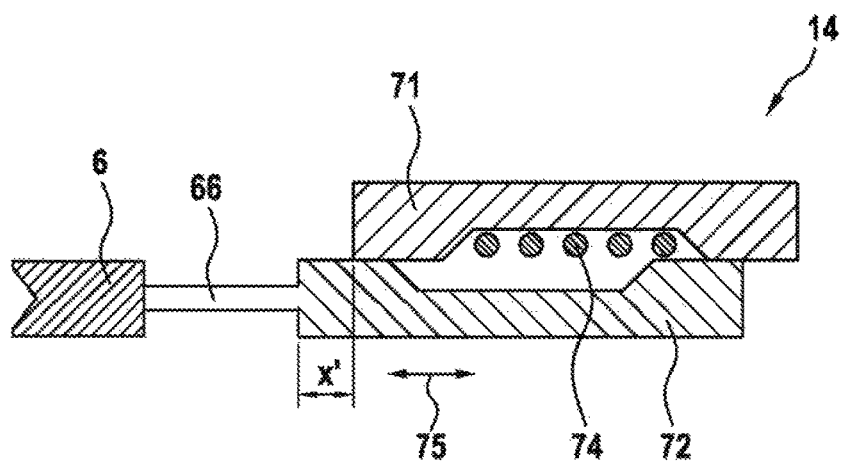
FIG. 17 shows a schematic side view of an alternative exemplary embodiment of an actuator with an electromagnetic linear drive in a second position.

FIG. 17 shows the situation of the exemplary embodiment shown in FIG. 16 of an actuator 14 after switching off the supply voltage. The subsiding magnetic forces have the effect that the spring (not shown) displaces the movable reluctance layer 6 into the second position. The displacement of the first reluctance layer 6 is indicated by x*. The linear actuator 14 shown makes possible a braking and holding force that can be set in both directions X and Y. Correspondingly, versions of the arrangement shown for "pneumatically bistable" and "pneumatically linear" actuators can be realized by analogy with the electrical activations according to FIGS. 14 to 17 with pneumatic energy sources.

Figure 18:
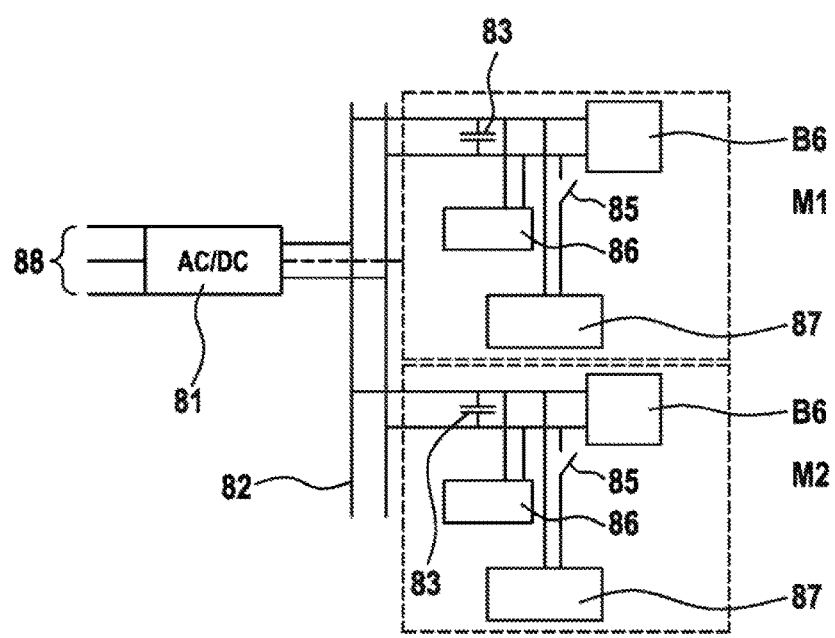
FIG. 18 shows a schematic overview of a circuit for the modular power supply and control of an actuator.

FIG. 18 shows a schematic circuit for supplying and controlling the actuators according to the systems 90 and the transport systems 100 described above. The circuit represents a modular energy supply and activation of the actuators. The circuit is fed by a three-phase system 88, the voltage of which (for example 3×380 V) is converted by way of an AC/DC converter 81 to a central DC link voltage in a bus bar 82. Shown by way of example are two modules M1, M2, which can be added to in any desired number in a way corresponding to the mechanical conditions in an actual implementation. Reference numeral 83 indicates a local voltage buffer in the form of a DC link capacitor, which lies parallel to an electrical energy store 86. The electrical energy store 86 may be realized for example in the form of a capacitor, a super cap, a rechargeable battery or the like for braking by motor in the event of a voltage interruption. A module-specific activating circuit 87 for the drive, including a has position, is cut in by way of a switch 85. A B6 bridge is provided for the activation of the linear motors or the induction coils 4 (divided for a driving force in the direction of the x coordinate and y coordinate). The structure of a B6 bridge is sufficiently well known in the literature and is not discussed any further here.

The presented systems or transport systems according to the present disclosure may be used for example for pharmaceutical applications or in production and assembly engineering, without the applications of the present disclosure being restricted to the aforementioned areas.

The invention claimed is:

1. A system for moving transport bodies excited by permanent magnets over an inductively excited magnetic field, comprising:
   a movably supported first reluctance element;
   induction coils configured to be flowed through by a current in order to levitate the transport bodies contactlessly and drive the transport bodies in a plane; and
   an actuator configured to bring the first reluctance element from a first position into a second position,
   wherein a permanent magnetic field of a transport body located over the first reluctance element experiences a smaller magnetic resistance in a magnetic circuit as a result of the first reluctance element in the second position than in the first position.

2. The system as claimed in claim 1, wherein the actuator is configured to bring the first reluctance element out of the first position into the second position in the event of a power failure in order to brake its movement in the plane.

3. The system as claimed in claim 1, wherein the system is configured to change the magnetic resistance of the system for a permanent magnetic field excited by a transport body by the first reluctance element to a greater degree at a position over the first reluctance element than at a position alongside the first reluctance element with respect to the movement of the transport bodies.

4. The system as claimed in claim 1, wherein the actuator is configured to bring the first reluctance element into a different position with respect to a second reluctance element of the system in order to change a magnetic resistance through the first reluctance element and the second reluctance element.

5. The system as claimed in claim 4, wherein the actuator is configured to change a distance between the first reluctance element and the second reluctance element.

6. The system as claimed in claim 1, wherein the actuator is configured to displace the first reluctance element one or more of:
   substantially parallel to the plane of the direction of movement of the transport bodies,
   substantially perpendicular to the plane of the direction of movement of the transport bodies, and
   to rotate the first reluctance element about an axis situated substantially in the plane of the direction of movement of the transport bodies.

7. The system as claimed in claim 1, wherein the first reluctance element comprises laminated sheet-metal elements that are (i) oriented substantially perpendicular to the plane of the direction of movement of the transport bodies in the first position and (ii) oriented substantially parallel to the plane of the direction of movement of the transport bodies in the second position.

8. The system as claimed in claim 1, wherein the first reluctance element is at least partially arranged between two second reluctance elements, wherein the second reluctance elements have a cross section that continuously decreases in a direction perpendicular to the plane of the direction of movement of the transport bodies, and wherein one or more of:

the actuator is configured to move the first reluctance element perpendicularly in relation to the plane of the direction of movement of the transport bodies, and the first reluctance element has a surface that corresponds over the surface area to a surface of the second reluctance elements at least in the second position.

9. The system as claimed in claim 1, wherein the actuator comprises an energy storage mechanism.

10. A transport system, comprising
a transport body comprising a carrying body and permanent magnets; and
a system for moving the transport body, the system including:
a movably supported first reluctance element,
induction coils configured to be flowed through by a current in order to levitate the transport body contactlessly and drive the transport body in a plane, and
an actuator configured to bring the first reluctance element from a first position into a second position,
wherein the permanent magnets are arranged over the system substantially along a plane of a direction of movement of the transport body and produce a magnetic pattern, so that, together with the first and second reluctance elements of the system, a strongly location-dependent force effect is obtained in the direction of the plane, location-dependent differences in the force effect being intensified by the first reluctance element in the second position.

11. The system as claimed in claim 1, wherein the actuator is configured to bring the first reluctance element into a different position with respect to a fixed second reluctance element of the system in order to change a magnetic resistance through the first reluctance element and the fixed second reluctance element.

12. The system as claimed in claim 9, wherein the energy storage mechanism is configured as one or more of a spring, a hydraulic energy store, a pneumatic energy store, and an electrical energy store.

* * * * *